United States Patent [19]

Tani et al.

[11] Patent Number: 5,002,217
[45] Date of Patent: Mar. 26, 1991

[54] BONDING METHOD AND BONDING APPARATUS

[75] Inventors: Mitsukiyo Tani, Odawara; Hideo Shiraishi, Atugi, both of Japan

[73] Assignees: Hitachi, Ltd., Tokyo; Hitachi Computer Electronics Co., Ltd., Hadano, both of Japan

[21] Appl. No.: 413,822

[22] Filed: Sep. 28, 1989

[30] Foreign Application Priority Data

Oct. 11, 1988 [JP] Japan ................................. 63-253763

[51] Int. Cl.⁵ ........................ B23K 3/00; H01L 21/607
[52] U.S. Cl. ................................... 228/110; 228/111;
228/1.1; 219/56.21; 219/56.22; 219/85.18
[58] Field of Search ................. 228/110, 111, 179, 1.1,
228/4.5; 219/56.21, 56.22, 85.16, 85.18

[56] References Cited

U.S. PATENT DOCUMENTS

| | | | |
|---|---|---|---|
| 3,481,839 | 12/1969 | Inoue | 228/111 |
| 3,747,198 | 7/1973 | Benson et al. | 228/111 |
| 3,934,108 | 1/1976 | Howard | 219/85.18 |
| 4,315,128 | 2/1982 | Matcovich et al. | 219/85.18 |
| 4,674,671 | 6/1987 | Fister et al. | 228/111 |
| 4,821,944 | 4/1989 | Tsumura | 228/111 |

FOREIGN PATENT DOCUMENTS 2238484 3/1974 Fed. Rep. of Germany ... 228/110 F
2541911 7/1977 Fed. Rep. of Germany ...... 228/110

OTHER PUBLICATIONS

Modern Metals, "Soldering Aluminum with Sound Waves", p. 36, Jul. 1948.
Electronics, "Ultrasonic Iron Solders Aluminum", Oct. 1, 1977.
Electronic Equipment News, "Ultrasonic Assembly to Electronics", vol. 12, No. 8, pp. 36–42, Nov. 1970.

Primary Examiner—Sam Heinrich
Attorney, Agent, or Firm—Kenyon & Kenyon

[57] ABSTRACT

A bonding method and apparatus for bonding a wire material having a ball-like end on a bonding pad is disclosed. While the ball of the wire material on the bonding pad is being pressed by a bonding tip, an ultrasonic wave and a high frequency current are applied in combination to the bonding tip so as to improve strength of the bonding portion.

11 Claims, 2 Drawing Sheets

BONDING METHOD AND BONDING APPARATUS

BACKGROUND OF THE INVENTION

This invention relates to a bonding method and apparatus for making wiring inside a miniature component More particularly, the present invention relates to a bonding method and apparatus which will be suitable for ball bonding.

The conventional bonding method used for wiring of a semiconductor as typified by so-called "nail head bonding", which is disclosed, for example, in Japanese Patent Laid-Open No. 71642/1986, forms a ball at one of the ends of a thin metal wire, pushes this ball from above and connects it to a substrate by use of a capillary, forms a ball at the other end of the thin wire and connects it in the same way. Japanese Patent Laid-Open No. 173951/1982 discloses a method which is referred to as "wedge bonding".

The prior art technique described above does not take into consideration the shape of the ball after bonding and involves particularly the problem of the shape of the upper part of the ball In other words, the prior art technique has the structure wherein the wire is wired in the vertical direction of the ball after bonding and the shape of the upper part of the ball after bonding is inclined This shape is extremely disadvantageous for bringing a probe pin into contact with the ball from above after bonding in order to check the connection of the bonding portion and the function of the component. Also, the shape described above is disadvantageous, for high reliability connection when ball bonding is made in superposition on the bonding portion.

SUMMARY OF THE INVENTION

The present invention provides a bonding method and apparatus which provides a desirable shape of the bonding portion.

The present invention also improves the strength of the bonding portion.

A bonding method according to the present invention brings a bonding wire having a ball-like pressure contact with a desired position and makes bonding by use of an ultrasonic wave. The bonding method is further characterized in that the pressure contact described above is conducted by high frequency power heating while the bonding wire is pressed by use of a flat heating tip.

A bonding apparatus according to the present invention comprises a bonding tip for bringing a bonding wire having a ball-like tip into pressure contact with a material to be bonded, an ultrasonic oscillator for applying an ultrasonic wave to the bonding tip and heating means for high frequency heating the bonding tip.

The bonding method of the present invention is conducted by high frequency power heating of a bonding tip for pressing substantially vertically a wire ball, for example, while ultrasonic oscillation is being applied to the bonding tip. The frequency of the high frequency oscillation is preferably within the range of 30 kHz–90 kHz and its amplitude is preferably several microns The frequency of high frequency power supply is preferably within the range of 200 Hz~2 kHz.

FIG. 6 shows bonding strength of the bonding portion bonded by the method of the present invention in comparison with that of other methods. It shows that when ultrasonic wave and high frequency heating are used in combination, bonding strength increases more greatly than by other methods such as the use of the ultrasonic wave and A.C. heating in combination.

When the tip is energized by both un ultrasonic wave and a large high-frequency current, a beat vibration appears in addition to the ultrasonic vibration. This increases the friction at the interface between the tip and the ball and thus flattens the top of the bond. At the same time, the friction between the bonding pad and the ball increases correspondingly, and thus the bonding strength increases. In other words, the combination of ultrasonic vibration and high-frequency heating produces a beat frequency equal to the difference between the frequency of the ultrasonic wave (Hz) and the high frequency (Hz), and this beat frequency generates the frictional force described above. The beat vibration amplitude as the sum of the amplitude of the ultrasonic wave alone at the resonance point and power supply oscillation of the tip itself. This increases the work done so that friction at the time of bonding has greater effect.

DETAILED DESCRIPTION

Hereinafter, a preferred embodiment of the present invention will be explained with reference to the accompanying drawings.

Figure 4:
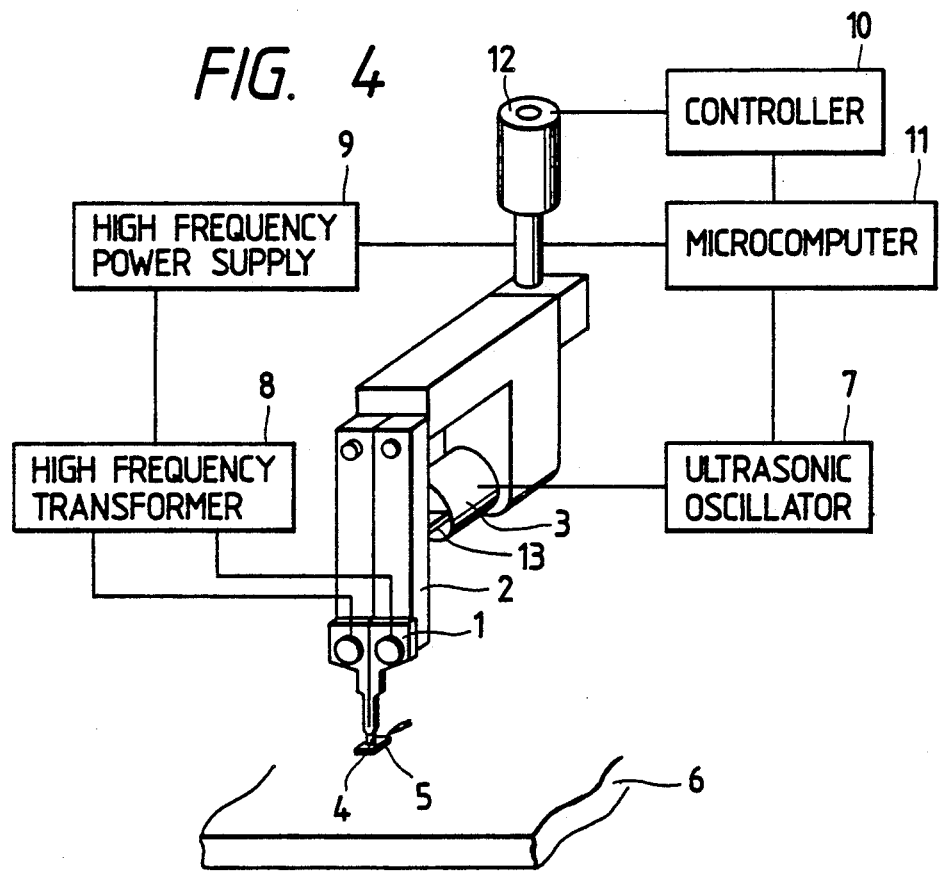
FIG. 4 is a schematic structural view showing an example of the bonding apparatus in accordance with the present invention.

FIG. 4 is a schematic perspective view showing an example of the bonding apparatus in accordance with an embodiment of the present invention. A bonding tip 1 having a flat top is held by a tip holder 2. A ultrasonic horn 3 is pushed to the drum of the holder 2 through an insulating block 13 A heat portion including these members can descend vertically by a motor drive mechanism 12 and a ball screw (not shown). The bonding tip 1 is formed by working a tungsten sheet in a U-shape and applying a flattening work to its tip. A high frequency voltage is applied between both ends of the tip from a high frequency constant power source 9 through a high frequency transformer 8 and power is supplied to it. Intensity and time of ultrasonic oscillation is controlled by an ultrasonic oscillator 7 Incidentally, reference numeral 10 represents a controller for controlling the motor drive mechanism 12, 6 is a circuit substrate, 5 is a bonding pad and 4 is a wire material (equipped with a ball) The high frequency constant power source 9, controller 10 and the ultrasonic oscillator 7 are all controlled by control means 11 which can be a microcomputer.

Figure 1:
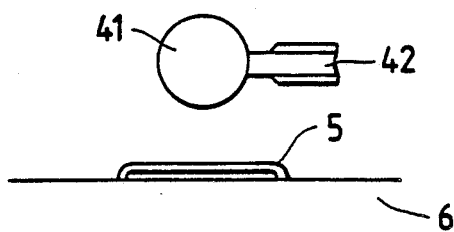
FIG. 1 is a front view showing the state where a wire material having a ball formed at its end is disposed on a bonding pad.
Figure 2:
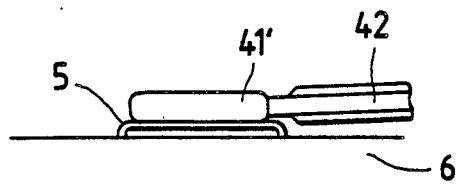
FIG. 2 is a front view showing the state where ball bonding is made so that the shape of the upper surface of the bonding portion becomes flat.
Figure 3:
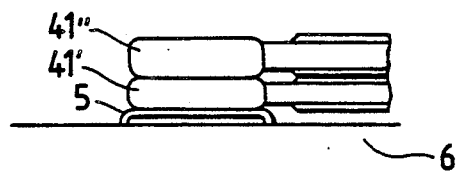
FIG. 3 is a front view showing the state where ball bonding is made in superposition on the ball bonding portion which has already been ball-bonded.

Next, the bonding procedures by use of this apparatus will be explained As shown in FIG. 1, the wire material 42 having the ball 41 at its tip is disposed on the bonding pad 5 in such a manner that the wire material 42 is substantially in parallel with the substrate 6. Pressure is applied from above the wire material 42 by the bonding tip 1, ultrasonic wave is then applied and furthermore, high frequency power supply heating is made for bonding so that the shape of the upper surface of the bonding portion 41' becomes flat as shown in FIG. 2 If bonding is made in such a shape, bonding can further be made on the bonding portion 41' as shown in FIG. 3 and when a conduction check is carried out after connection, the flat portion of the upper surface of the bonding portion 41' or 41" can be probed.

Figure 5:
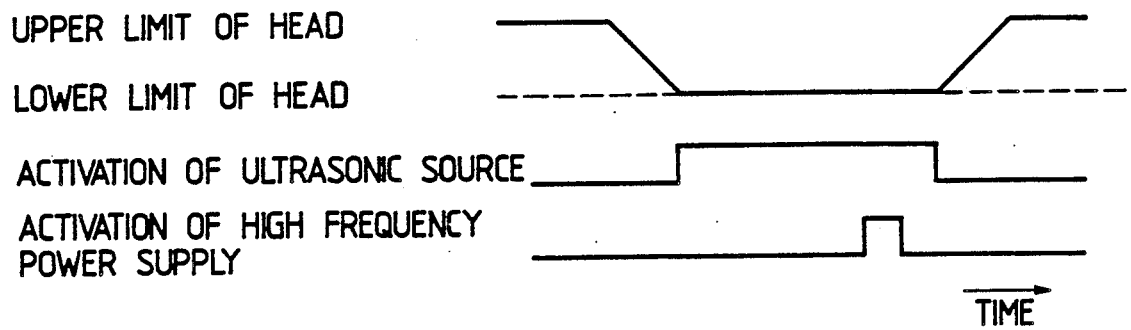
FIG. 5 is a time chart showing the time sequence at the time of bonding.

The bonding operation described above is controlled by the control means 11 in accordance with the time sequence shown in FIG. 5 and the application of the ultrasonic wave is carried out at the point of time at which pressurization has been complete sufficiently. The activation of high frequency power supply, too, is made by a system which activates and heats instantaneously after a few seconds from ultrasonic oscillation so as to prevent any thermal influences on the wire material and the metallized structure of the base. The bonding operation can be carried out by the methods other than the method having the time sequence shown in FIG. 5.

In the embodiment described above, the frequency of the ultrasonic wave is 60 kHz and the frequency of high frequency heating is 400 Hz but the same effect can be obtained when the frequency of the ultrasonic wave and that of high frequency heating are selected from the range of from 30 kHz~90 kHz and from the range of from 200 Hz~2 kHz, respectively.

Figure 6:
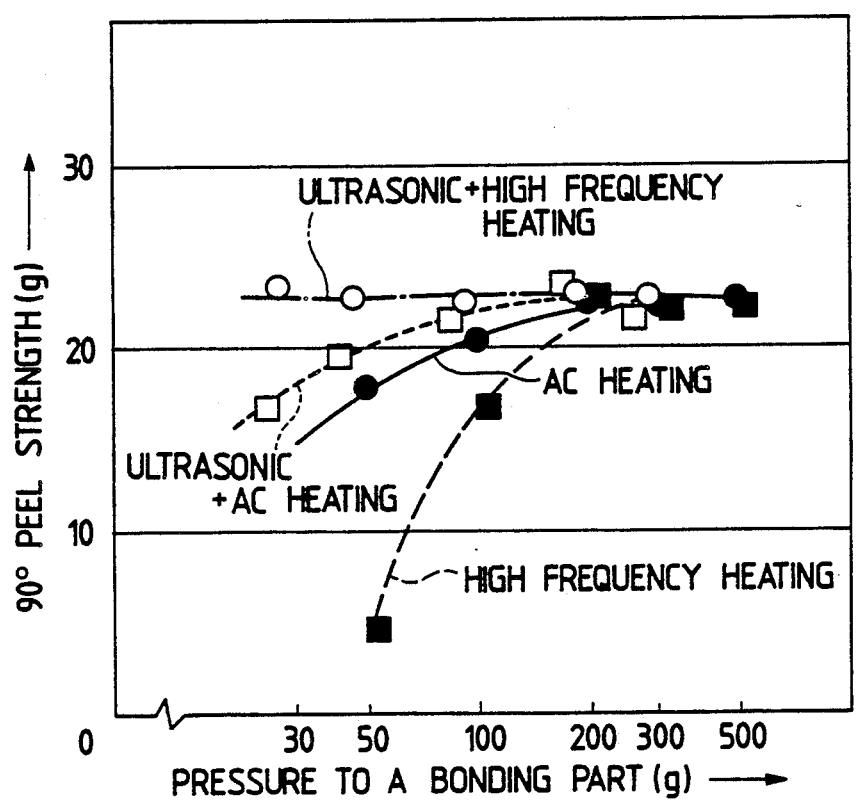
FIG. 6 is a diagram showing strength of the bonding portion and useful for explaining the effect of the present invention.

In accordance with the present invention, high strength flat bonding, that has not been possible by the conventional bonding methods, can now be accomplished. As to strength, in particular, a bonding connection having extremely high strength in comparison with other methods can be obtained by employing the ultrasonic wave and high frequency heating bonding as shown in FIG. 6. A high reliability connection can be obtained. Since flat bonding which is different from the conventional bonding can be conducted, probing for inspection after connection and wiring becomes possible. Furthermore, since superposition connection of ball bonding can be made, a high density package of wirings in a minute space becomes possible.

What is claimed is:

1. An apparatus for bonding a wire material having a ball-like end onto a bonding pad, said bonding apparatus comprising:
    a bonding tip made of an electric conductor having electric resistance, said bonding tip having a pair of ends for receiving electric voltages and a portion providing an electric current path between said pair of ends for pressing said ball wire material on said bonding pad;
    mean for generating an ultrasonic wave and for applying said generated ultrasonic wave to said bonding tip;
    means for concurrently applying a high frequency current to said pair of ends of said bonding tip as said ultrasonic wave is applied to said bonding tip, said high frequency current flowing in said electric path, said tip being heated by said high frequency current and its electric resistance; and
    means for vertically moving said bonding tip while applying said high frequency current causing said bonding tip to press the ball-like end onto said bonding pad.

2. The bonding apparatus according to claim 1, wherein the frequency of said ultrasonic wave is selected from the range of 30 kHz to 90 kHz.

3. The bonding apparatus according to claim 1, wherein the frequency of said high frequency current is selected from the range of 200 Hz to 2 kHz.

4. An apparatus according to claim 1, wherein said bonding tip comprises tungsten.

5. An apparatus according to claim 4, wherein said bonding tip comprises a U-shape material a pair of ends of the U-shape defining said pair of ends of the bonding tip.

6. An apparatus according to claim 5, wherein said apparatus further comprises means for providing said wire material having said ball-like end parallel to a surface of the bonding pad.

7. An apparatus for bonding a wire material having a ball-like end onto a bonding pad, said bonding apparatus comprising:
    a bonding tip made of an electric conductor having electric resistance, said bonding tip having a pair of ends for receiving electric voltages and a portion providing an electric current path between said pair of ends for pressing said ball wire material on said bonding pad;
    means for providing said wire material having said ball-like end parallel to a surface of the bonding pad;
    means for generating an ultrasonic wave and for applying said generated ultrasonic wave to said bonding tip;
    means for concurrently applying a high frequency current to said pair of ends of said bonding tip as said ultrasonic wave is applied to said bonding tip, said high frequency current flowing in said electric path, said tip being heated by said high frequency current and its electric resistance; and
    means for vertically moving said bonding tip while applying said high frequency current causing said bonding tip to press the ball-like end onto said bonding pad.

8. A bonding method for bonding a wire material having a ball-like end onto a bonding pad, said bonding method comprising the steps of:
    providing a bonding tip made of an electric conductor having electric resistance, said bonding tip having a pair of ends for receiving electric voltages and a portion providing an electric current path between said pair of ends for pressing said ball wire material on said bonding pad;
    providing said wire material having said ball-like end parallel to a surface of the bonding pad;
    generating an ultrasonic wave;
    applying said generated ultrasonic wave to said bonding tip; concurrently applying a high frequency current to said pair of ends of said bonding tip as said ultrasonic wave is applied to said tip, said high frequency current flowing in said electric path, said tip being heated by said high frequency current and its electric resistance; and
    vertically moving said bonding tip while applying a high frequency current so that said bonding tip presses said ball-like end onto said bonding pad.

9. A bonding method according to claim 8, wherein said bonding method further comprises the steps of:

after boding said ball-like end of said wire onto said bonding pad, providing another ball-like end of another wire onto a previously bonded end of said first mentioned wire parallel to a surface of the bonding pad;

applying said generated ultrasonic wave to said bonding tip;

concurrently applying a high frequency current to said pair of ends of said bonding tip as said ultrasonic wave is applied to said tip, said high frequency current flowing in said electric path, said tip being heated by said high frequency current and its electric resistance; and vertically moving said bonding tip while applying a high frequency current so that said bonding tip presses said another ball-like end onto said previously bonded end.

10. The bonding method according to claim 8, wherein the frequency of said ultrasonic wave is selected from the range of 30 kHz to 90 kHz.

11. The bonding method according to claim 8, wherein the frequency of said high frequency current is selected from the range of 200 Hz to 2 kHz.

* * * * *

UNITED STATES PATENT AND TRADEMARK OFFICE
CERTIFICATE OF CORRECTION

PATENT NO. : 5,002,217
DATED : March 26, 1991
INVENTOR(S) : Mitsukiyo Tani et al It is certified that error appears in the above-identified patent and that said Letters Patent is hereby corrected as shown below:

| Column | Line | |
|---|---|---|
| 1 | 24 | After "ball" insert --.--. |
| 1 | 43 | After "ball-like" insert --tip into--. |
| 1 | 62 | After "microns" insert --.--. |
| 2 | 37 | After "bonding" delete "; and". |
| 2 | 49 | Change "A" to --An--. |
| 2 | 51 | After "13" insert --.--. |
| 2 | 61 | After "7" insert --.--. |
| 2 | 65 | After "ball)" insert --.--. |
| 3 | 2 | After "explained" insert --.--. |
| 3 | 10 | After "Fig. 2" insert --.--. |
| 4 | 14 | After "material" insert --,--. |
| 5 | 3 | Change "boding" to --bonding--. |

Signed and Sealed this

Seventeenth Day of November, 1992

*Attest:*

DOUGLAS B. COMER

*Attesting Officer*   *Acting Commissioner of Patents and Trademarks*